United States Patent [19]
Friedrich et al.

[11] Patent Number: 4,694,117
[45] Date of Patent: Sep. 15, 1987

[54] SOLAR CELL

[75] Inventors: Gerda Friedrich, Unterheinriet; Klaus-Dieter Rasch, Nordheim; Wilfried Schmidt, Talheim, all of Fed. Rep. of Germany

[73] Assignee: Telefunken Electronic GmbH, Heilbronn, Fed. Rep. of Germany

[21] Appl. No.: 858,173

[22] Filed: May 1, 1986

[30] Foreign Application Priority Data

May 4, 1985 [DE] Fed. Rep. of Germany ....... 3516117

[51] Int. Cl.⁴ .............................................. H01L 31/06
[52] U.S. Cl. ...................................... 136/256; 357/30; 357/65

[58] Field of Search .................. 136/255, 256; 357/30, 357/65

[56] References Cited

U.S. PATENT DOCUMENTS 4,479,027 10/1984 Todorof .............................. 136/249
4,590,327 5/1986 Nath et al. .......................... 136/256

Primary Examiner—Aaron Weisstuch
Attorney, Agent, or Firm—Spencer & Frank

[57] ABSTRACT

The invention relates to a solar cell provided with an anti-reflection layer on the surface intended for incident light. The invention consists in the front interconnector being applied directly to the anti-reflection layer of insulating material, so that the charge carriers have to tunnel through this anti-reflection layer.

6 Claims, 3 Drawing Figures

SOLAR CELL

BACKGROUND OF THE INVENTION

The invention relates to a solar cell comprising a semiconductor body containing a pn-junction, said body being provided with a reflection-reducing layer on the surface intended for incident light and having a rear contact on the opposite surface.

Silicon solar cells are provided with an anti-reflection layer on the surface intended for incident light to increase their cell conversion efficiency. This reflection-reducing layer comprises an insulating material and therefore must not, in known solar cell arrays, cover the front contact provided for connection to other cells. The thickness of the reflection-reducing layer is selected so that the minimum reflection occurs at approx. 600 nm. This is generally a $\lambda/4$ layer of an oxide with a refraction index of 1.4 to 2.4. The reflection-reducing layer reduces the reflectivity of the solar cell surface in the wavelength range between 0.3 and 1.2 $\mu m$ from approx. 30% to less than 10%, considerably increasing the efficiency of the solar cell.

A solar cell is already known from U.S. Pat. No. 4,336,648 where the reflection-reducing layer completely covers the metallic front contact of the solar cell and where the connection between the said front contact and connector stripes is achieved by ultrasonic welding, with the reflection-reducing layer being locally removed in the connection area by the welding operation.

SUMMARY OF THE INVENTION

The object underlying the present invention is to provide a solar cell which can be interconnected in a very simple manner without the necessity of ultrasonic welding. The solar cell according to the present invention should be particularly useful in the low intensity radiation range. This object is attained in accordance with the invention with a solar cell of the kind mentioned at the outset by applying at least one front interconnecting lead directly to the reflection-reducing layer of insulating material, so that the charge carriers pass from the semiconductor body to the front interconnector by tunnelling through the reflection-reducing layer.

In the solar cell according to the present invention, there is therefore no direct connection between the semiconductor body or the front contact and the applied interconnector arranged on the reflection-reducing layer, but instead the charge carriers tunnel through the thin intermediate area of the reflection-reducing layer.

In projection, the front interconnecting lead is above an ohmic connecting contact on the semiconductor body, said contact being designed as a grid or as a simple conducting path of metal. In a preferred embodiment of the invention, this ohmic connecting contact is dispensed with completely, so that the current is drawn off directly from the semiconductor body via the reflection-reducing layer to the interconnector on the reflection-reducing layer.

The design of the solar cell according to the present invention is especially recommended for use in the low radiation intensity range. At low light intensities of less than 500 Lux, a current of less than 50 $\mu A/cm^2$ flows in the semiconductor body. The voltage drop caused by this current in the semiconductor body and at the series resistor of the reflection-reducing layer is negligible. It is therefore possible to design the ohmic connecting contact on the semiconductor surface only as a metal conducting path or to dispense completely with this connecting contact. The invention and its advantageous design are explained in the following with reference to embodiments.

BRIEF DESCRIPTION OF THE DRAWINGS

FIG. 3 shows a solar cell where a metal connecting contact directly on the front of the semiconductor body is dispensed with.

DESCRIPTION OF THE PREFERRED EMBODIMENTS

Figure 1:
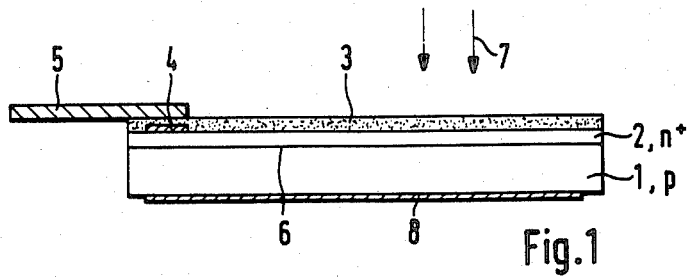
FIG. 1 is a sectional view of the solar cell with a front interconnecting lead on the reflection-reducing layer.
Figure 2:
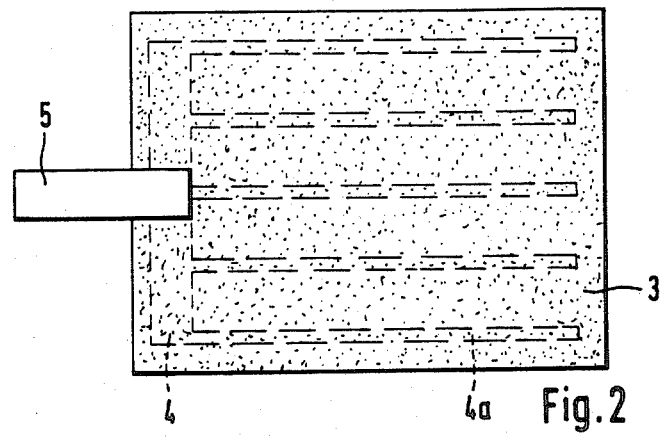
FIG. 2 is a plan view of this solar cell.

The solar cell of FIG. 1 comprises for example a p-conductive silicon semiconductor body with a thickness between 100 and 500 $\mu m$ and a conductivity between 0.1 and 10 $\Omega cm$. Amorphous silicon or III/V compounds are suitable as the semiconductor material as well as single-crystal or poly-crystalline silicon. The semiconductor body contains a pn-junction 6, made by diffusion, implantation, or epitaxy, to provide a surface layer 2 which is $n^+$-conductive overlying a p-doped base material 1. The $n^+$-conductive layer 2 has, for instance, a thickness of 0.3 to 0.5 $\mu m$ and a sheet resistance of 20 to 120 $\Omega/\square$ in a crystalline silicon solar cell. An ohmic connecting contact 4 is arranged on the semiconductor layer 2, said contact being of aluminium or titanium-palladium-silver. However, materials such as gold, chrome, gold-chrome combinations, silver, nickel, or a conductive oxide are possible for the connecting contact. The connecting contact, which according to the plan view in FIG. 2 has the form of a conductive strip 4 with strips 4a extending from it like fingers, can be applied by evaporation deposition, printing, or electrolytically.

The entire front of the semiconductor body intended for incident light 7 is then covered with a reflection-reducing layer 3. This reflection-reducing layer consists of titanium oxide or of a titanium compound oxide, silicon monoxide, silicon dioxide, silicon nitride, tantalum oxide, niobium oxide, aluminium oxide, or magnesium fluoride. It is also possible for the reflection-reducing layer to contain several of the above elements or to be built up of several layers, having a total thickness of 70 nm, for example. The reflection-reducing layer 3 can be produced thermally, by evaporation deposition, centrifugal application, printing, spraying, or immersion.

In solar cells for low radiation intensity ranges, it is sufficient for the connecting contact 4 to be designed only as a conductive path, since the voltage drop in the semiconductor layer 2 is negligible with the low currents present.

Finally, the front interconnector lead 5 is applied to the reflection-reducing layer 3, said interconnector being, in projection, at least partly above the ohmic connecting contact 4, so that the charge carriers only have to tunnel through the thickness of the reflection-reducing layer on their way from the semiconductor body to the front contact. The front interconnector 5 can consist of a supporting foil coated with a conductive adhesive, glued-on conductive paths, or glued-on wires. The preferred embodiment is for the front interconnector to project over the lateral edge of the semiconductor body and so function as a connecting lead to other solar cells which together make up a solar cell battery. The interconnectors 5 are preferably glued onto the reflection reducing layer 3. Metal wires can also be used, coated, for example, with thermally activatable adhesive or conductive adhesive, providing a firm connection between the wire and the reflection-reducing layer when they are pressed together.

To apply the interconnector lead, conductive adhesives can also be used, these being silver-, graphite-, gold-, copper-, or nickel-filled epoxy resins, acrylic resins, or polyimide resins which are applied by screen printing or stamping techniques, or in liquid form, and are then tempered until hardened. Thermally activatable conductive adhesives can also be used which do not develop their adhesive property until subjected to pressure and temperature. Adhesives of this type are commercially available. The conductive adhesives mentioned are preferably applied to an insulting base, comprising, for example, a plastic film or glass sheet. This coated base is applied to the reflection-reducing layer of the solar cell such that the conductive layer comes into contact with the reflection-reducing layer and, supported by the base, projects over the lateral edge of the solar cell in the manner illustrated. The base is preferably translucent.

Figure 3:
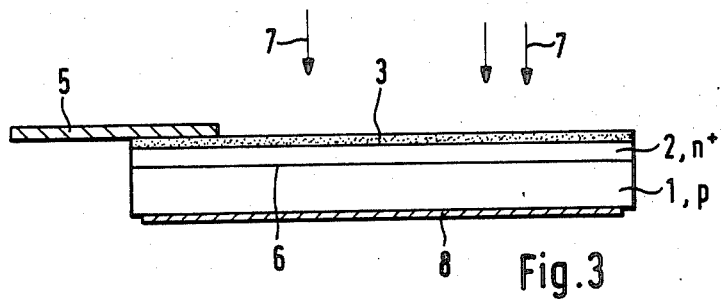

FIG. 3 shows a further variation of the solar cell in accordance with the present invention wherein the ohmic connecting contact 4 is omitted on the semiconductor layer 2. The current therefore flows directly from the semiconductor layer 2 through the reflection-reducing layer 3 to the front contact 5. This in turn is only possible if the solar cell is used at low light intensity below approx. 500 Lux, since in that instance the current flowing through the solar cell in the $\mu$A range causes negligible voltage drops in the semiconductor body and in the reflection-reducing layer.

In FIGS. 1 and 3, the rear contact of the solar cell is numbered 8. The solar cells in accordance with the present invention are particularly suited for use in the consumer field, for instance, building up solar cell modules for pocket calculators or other small instruments. The solar cells themselves have a relatively small area of approx. 1 cm$^2$, so that an adequate current supply through the front interconnector is possible without the said interconnector covering a substantial part of the semiconductor body 1, 2.

What is claimed is:

1. Solar cell comprising a semiconductor body (1, 2) containing a pn-junction (6), said body being provided with a reflection-reducing layer (3) on the surface intended for incident light (7) and having a rear contact (8) on the opposite surface, wherein at least one front interconnector (5) is directly applied to the reflection-reducing layer (3) of insulating material, so that the charge carriers pass from the semiconductor body (1, 2) to the front interconnector (5) by tunnelling through the reflection-reducing layer (3).

2. Solar cell according to claim 1, wherein the front interconnector (5) is arranged above an ohmic metal connecting contact (4) located underneath the reflection-reducing layer (3) and contacting the light incident surface layer (2) of the semiconductor body.

3. Solar cell according to claim 1, wherein the front interconnector (5) is arranged on the reflection-reducing layer (3) without an ohmic connecting contact being provided on the light incident surface layer (2) of the semiconductor body underneath the reflection-reducing layer (3).

4. Solar cell according to claim 1, wherein the front interconnector (5) consists of conductive adhesives on a supporting base, glued-on conductive paths, or glued-on wires.

5. Solar cell according to claim 1, wherein the reflection-reducing layer (3) consists of TiO$_x$ and is approx. 0.07 $\mu$m thick.

6. Solar cell according to claim 1, constructed for receiving light in the low radiation intensity range up to approximately 500 Lux.

* * * * *